(12) United States Patent
Kim et al.

(10) Patent No.: US 11,987,670 B2
(45) Date of Patent: May 21, 2024

(54) POLYIMIDE FILM FOR GRAPHITE SHEET HAVING IMPROVED THERMAL CONDUCTIVITY, METHOD FOR MANUFACTURING SAME, AND GRAPHITE SHEET MANUFACTURED USING SAME

(71) Applicant: PI ADVANCED MATERIALS CO., LTD., Chungcheongbuk-do (KR)

(72) Inventors: Kyung Su Kim, Seoul (KR); Jeong Yeul Choi, Anyang-Si (KR); Dong Young Won, Seoul (KR)

(73) Assignee: PI ADVANCED MATERIALS CO., LTD., Chungcheongbuk-do (KR)

( * ) Notice: Subject to any disclaimer, the term of this patent is extended or adjusted under 35 U.S.C. 154(b) by 939 days.

(21) Appl. No.: 16/975,734

(22) PCT Filed: Jul. 20, 2018

(86) PCT No.: PCT/KR2018/008198
§ 371 (c)(1),
(2) Date: Aug. 26, 2020

(87) PCT Pub. No.: WO2019/164067
PCT Pub. Date: Aug. 29, 2019

(65) Prior Publication Data
US 2020/0407505 A1    Dec. 31, 2020

(30) Foreign Application Priority Data

Feb. 26, 2018  (KR) .................. 10-2018-0023077

(51) Int. Cl.
| | | |
|---|---|---|
| *C08G 73/10* | (2006.01) |
| *B29C 41/00* | (2006.01) |
| *B29C 41/46* | (2006.01) |
| *C01B 32/205* | (2017.01) |
| *C08J 5/18* | (2006.01) |
| *C08K 3/32* | (2006.01) |
| *C09K 5/14* | (2006.01) |
| *H05K 7/20* | (2006.01) |
| *B29K 79/00* | (2006.01) |
| *B29K 509/02* | (2006.01) |
| *B29L 7/00* | (2006.01) |

(52) U.S. Cl.
CPC ........ *C08G 73/1071* (2013.01); *B29C 41/003* (2013.01); *B29C 41/46* (2013.01); *C01B 32/205* (2017.08); *C08J 5/18* (2013.01); *C08K 3/32* (2013.01); *C09K 5/14* (2013.01); *H05K 7/2039* (2013.01); *B29K 2079/08* (2013.01); *B29K 2509/02* (2013.01); *B29L 2007/008* (2013.01); *C01P 2006/32* (2013.01); *C08J 2379/08* (2013.01); *C08K 2003/325* (2013.01)

(58) Field of Classification Search
CPC ... C08G 73/1071; B29C 41/003; B29C 41/46; C01B 32/205; C08J 5/18; C08J 2379/08; C08K 3/32; C08K 2003/325; C09K 5/14; H05K 7/2039; B29K 2079/08; B29K 2509/02; B29L 2007/008; C01P 2006/32
See application file for complete search history.

(56) References Cited

U.S. PATENT DOCUMENTS

| | | | |
|---|---|---|---|
| 7,758,842 B2 | 7/2010 | Nishikawa et al. | |
| 8,066,966 B2 | 11/2011 | Nishikawa et al. | |
| 8,337,800 B2 | 12/2012 | Nishikawa et al. | |
| 8,597,606 B2 | 12/2013 | Nishikawa et al. | |
| 8,865,111 B2 | 10/2014 | Nishikawa et al. | |
| 9,593,207 B2* | 3/2017 | Hsiang ............... | C08G 73/1071 |
| 2015/0130096 A1 | 5/2015 | Wand | |
| 2015/0130098 A1* | 5/2015 | Hsiang ............... | C08G 73/1071 528/340 |
| 2018/0312638 A1* | 11/2018 | Cho ................... | C08G 73/1071 |

FOREIGN PATENT DOCUMENTS

| | | |
|---|---|---|
| CN | 103289402 A | 9/2013 |
| KR | 10-2001-0011184 A | 2/2001 |
| KR | 10-2006-0096413 A | 9/2006 |
| KR | 10-2015-0055525 A | 5/2015 |
| KR | 20160116366 A | 10/2016 |
| KR | 10-2017-0049912 A | 5/2017 |

OTHER PUBLICATIONS

International Search Report and Written Opinion of the International Searching Authority, issued in PCT/KR2018/008198, dated Jan. 9, 2019; ISA/KR.

* cited by examiner

*Primary Examiner* — David Sample
*Assistant Examiner* — Donald M Flores, Jr.
(74) *Attorney, Agent, or Firm* — Harness, Dickey & Pierce, P.L.C.

(57) ABSTRACT

The present invention provides: a method for manufacturing a polyimide film for a graphite sheet having improved thermal conductivity; and the polyimide film. The present invention also provides a graphite sheet having excellent thermal conductivity, which is manufactured using the polyimide film.

14 Claims, No Drawings

POLYIMIDE FILM FOR GRAPHITE SHEET HAVING IMPROVED THERMAL CONDUCTIVITY, METHOD FOR MANUFACTURING SAME, AND GRAPHITE SHEET MANUFACTURED USING SAME

CROSS-REFERENCE TO RELATED APPLICATIONS

This application is a 371 U.S. National Phase of International Application No. PCT/KR2018/008198, filed Jul. 20, 2018, which claims priority to Korean Patent Application No. 10-2018-0023077, filed Feb. 26, 2018. The entire disclosures of the above applications are incorporated herein by reference.

TECHNICAL FIELD

The present invention relates to a polyimide film for graphite sheets having improved thermal conductivity, a method for manufacturing the same, and a graphite sheet manufactured using the same.

BACKGROUND ART

In general, elements of an electronic device generate heat upon operation of the electronic device. Thus, if the electronic device cannot discharge heat therefrom, the electronic device can suffer not only deterioration in performance thereof due to increase in temperature inside the electronic device, but also malfunction, decrease in lifespan, or explosion due to excessive heat generation.

In particular, with recent tendency towards high performance and reduction in weight and size of electronic devices, high integration of electronic elements has inevitably occurred and thus it becomes a very important issue to solve the problem of internal heat generation through effective dissipation of heat from the electronic device.

Although various heat dissipation mechanisms, such as heat sinks, cooling fans, and heat pipes, have been used to solve such a heat generation problem, these mechanisms basically occupy a considerably large space, thereby causing a problem of not being suitable for the recent trend towards a slim structure and miniaturization.

Accordingly, in recent years, a heat dissipation sheet, a heat dissipation pad or a heat dissipation paint is generally used as a cooling means for smartphones, tablets, thin film type display products, and the like.

Among these means, the heat dissipation sheet is based on the principle of improving heat dissipation through expansion of an overall cooling area by diffusing heat from a certain heat generation portion to an overall sheet region and may be manufactured in the form of a graphite sheet, a polymer-ceramic composite sheet, a multilayer coating metal thin film sheet, and the like.

As a method of manufacturing such a graphite sheet, there is an expanded graphite method in which natural graphite is dipped in a mixture of sulfuric acid and acetic acid, rapidly heated, and washed to remove the acids, followed by processing the resulting product into a film shape using a high pressure press.

However, since this method provides problems of deterioration in strength and properties of the graphite sheet due to remaining acid, a method of graphitization of a particular polymer film through direct heat treatment has been developed to solve such problems.

The method of graphitization of a particular polymer is simpler than conventional methods and has advantages including prevention of impurity entrance and good thermal conductivity or electrical conductivity approaching thermal conductivity or electrical conductivity of single crystal graphite. Specifically, a graphite sheet can be manufactured through heat treatment for carbonization and graphitization of a polymer film, such as polyimide, polybenzothiazole, polybenzobisthiazole, polybenzooxazole, polybenzobisoxazole, and the like.

Among these polymers, the polyimide includes a strong aromatic main chain and an imide ring having good chemical stability, thereby securing the highest levels of heat resistance, chemical resistance, electrical insulation, chemical resistance, and weather resistance. Thus, the polyimide is known as an optimal material for graphite sheets by securing excellent yield, crystallinity and thermal conductivity in manufacture of the graphite sheet.

However, a graphite sheet manufactured using such polyimide has a limit in satisfaction of heat dissipation performance required for recent electronic devices suffering from rapid increase in heat dissipation density.

In recent years, although there is an attempt to improve thermal conductivity of the graphite sheet by adding fillers having high thermal conductivity to the graphite sheet or by adjusting a temperature raising rate in carbonization and graphitization processes, not only can the fillers deteriorate processability and physical properties including mechanical strength and the like and is it difficult to control the elevation temperature at an ultrahigh temperature of several thousand degrees centigrade or more, but also there is a problem of insignificant improvement in thermal conductivity through these techniques.

Therefore, there is an urgent need for a fundamental technology capable of overcoming problems of a typical method for manufacturing a polyimide film known in the art and realizing a polyimide film and a graphite sheet which exhibit good thermal conductivity without deterioration in other properties.

DISCLOSURE

Technical Problem

Based on various studies and experiments, the inventors of the present invention confirmed that a graphite sheet manufactured using a polyimide film formed using a polyamic acid containing a catalyst having a certain composition can have improved thermal conductivity through adjustment of physical/chemical properties of the polyimide film, as described below. At the same time, the inventors also confirmed that thermal conductivity of the graphite sheet can be further improved through adjustment of a drying temperature of a precursor composition and an imidization temperature of a gel film to be within certain temperature ranges. Based on these findings, the inventors completed the present invention.

Technical Solution

It is an object of the present invention to provide a polyimide film for graphite sheets having improved thermal conductivity, a method for manufacturing the same, and a graphite sheet manufactured using the same.

Hereinafter, embodiments of the preset invention will be described in detail in the order of a "method for manufacturing a polyimide film", a "polyimide film", and a "graphite sheet".

It should be understood that terms or words used in this specification and claims have to be interpreted as having meanings and concepts consistent with the technical idea of the present invention rather than typical or dictionary interpretation on a principle that an inventor is allowed to properly define the concept of the terms in order to explain their own invention in the best way.

Therefore, since embodiments disclosed in this specification are merely preferred examples of the present invention and do not fully describe the technical idea of the present invention, it will be appreciated that there can be various equivalents and alterations thereto at a filing date of the present application.

As used herein, the singular forms "a," "an," and "the" are intended to include the plural forms as well, unless the context clearly indicates otherwise. It will be further understood that the terms "comprises," "comprising," "includes," and/or "including," as used in this specification, specify the presence of stated features, integers, steps, operations, elements, components, and/or groups thereof, but do not preclude the presence or addition of one or more other features, integers, steps, operations, elements, components, and/or groups thereof.

As used herein, "dianhydride" is intended to include a precursor or derivative thereof, which may not technically be a dianhydride, but will nevertheless react with diamine to form a polyamic acid, which in turn is converted into polyimide.

As used herein, "diamine" is intended to include a precursor or derivative thereof, which may not technically be a diamine, but will nevertheless react with dianhydride to form polyamic acid, which in turn is converted into polyimide.

It will be understood that disclosure of a range of values, a preferred range of values, or preferred upper and lower limits for a given parameter, such as amount and concentration, subsumes all possible sub-ranges for the parameter which may be obtained by combining any sets of values within upper and low limits or preferred values as disclosed. Unless indicated otherwise, it is intended that a numerical range recited herein encompass end points thereof, as well as all integers and fractions between the end points. Further, it is intended that the scope of the present invention not be limited to specific values used in defining a range for a certain parameter.

A method for manufacturing a polyimide film according to the present invention includes:

mixing an organic solvent, a diamine monomer and a dianhydride monomer to prepare a polyamic acid solution;

adding a dehydration agent, an imidization agent and a catalyst to the polyamic acid solution to prepare a precursor composition;

forming a gel film by casting the precursor composition onto a support, followed by drying the precursor composition; and imidizing the precursor composition through heat treatment of the gel film to form a polyimide film.

The catalyst may include a first catalyst having a linear structure and a second catalyst having a ring structure, in which the second catalyst may be present in an amount of 10 mol % to 30 mol % based on the total moles of the first catalyst and the second catalyst.

In the method according to the present invention, the first catalyst having a linear structure and the second catalyst having a ring structure may be added together to the precursor composition, particularly, such that the second catalyst can be present in a particular amount based on the total amount of the first catalyst and the second catalyst, thereby improving thermal conductivity without deterioration in physical properties. It is anticipated that the ring structure of the second catalyst will improve packing efficiency of polyimide molecules in the course of imidization of the polyamic acid.

If the content of the second catalyst is less than 10 mol %, the packing efficiency of the polyimide molecules cannot be improved enough to form a uniform repeat structure in manufacture of the graphite sheet, thereby providing insignificant improvement in thermal conductivity. If the content of the second catalyst exceeds 30 mol %, the polyimide film can suffer from deterioration in mechanical strength due to deterioration in imidization rate or a longer time is required for the same imidization rate, thereby deteriorating overall process efficiency.

In the step of mixing the organic solvent, the diamine monomer and the dianhydride monomer to prepare the polyamic acid solution, the polyamic acid solution may be prepared through polymerization of at least one diamine monomer and at least one dianhydride monomer ('acid dianhydride') in the organic solvent.

The dianhydride monomer applicable to preparation of the polyamic acid solution may include at least one of pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2', 3,3'-biphenyltetracarboxylic dianhydride, 3,3',4,4'-benzophenonetetracarboxylic dianhydride, 2,2-bis(3,4-dicarboxylphenyl)propane dianhydride, 3,4,9,10-perylenetetracarboxylic dianhydride, bis(3,4-dicarboxylphenyl)propane dianhydride, 1,1-bis(2,3-dicarboxylphenyl)ethane dianhydride, 1,1-bis(3,4-dicarboxylphenyl)ethane dianhydride, bis(2,3-dicarboxylphenyl)methane dianhydride, bis(3,4-dicarboxylphenyl)ethane dianhydride, oxydiphthalic anhydride, bis(3,4-dicarboxylphenyl)sulfone dianhydride, p-phenylene bis(trimellitic monoester acid anhydride), ethylene bis(trimellitic monoester acid anhydride), bisphenol A-bis(trimellitic monoester acid anhydride) and derivatives thereof, and mixtures thereof.

The diamine applicable to preparation of the polyamic acid solution may include at least one of 4,4'-oxydianiline, p-phenylenediamine, 4,4'-diaminodiphenylpropane, 4,4'-diaminodiphenylmethane, benzidine, 3,3'-dichlorobenzidine, 4,4'-diaminodiphenylsulfide, 3,3'-diaminodiphenylsulfone, 4,4'-di aminodiphenyl ether (4,4'-oxydianiline), 3,3'-diaminodiphenylether (3,3'-oxydianiline), 3,4'-diaminodiphenylether (3,4'-oxydianiline), 1,5-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl N-methyl amine, 4,4'-diaminodiphenyl N-phenyl amine, 1,4-diaminobenzene (p-phenylene diamine), 1,3-diaminobenzene, 1,2-diaminobenzene and derivatives thereof, and mixtures thereof. In general, the organic solvent applicable to preparation of the polyamic acid solution may include at least one of ketones, such as γ-butyrolactone, 1,3-dimethyl-imidazolidinone, methyl ethyl ketone, cyclohexanone, cyclopentanone, 4-hydroxy-4-methyl-2-pentanone, and the like; aromatic hydrocarbons, such as toluene, xylene, tetramethylbenzene, and the like;

glycol ethers (cellosolve), such as ethylene glycol monoethylether, ethylene glycol monomethylether, ethylene glycol monobutylether, diethylene glycolmonoethyl ether, diethylene glycol monomethylether, diethylene glycol monobutylether, propylene glycol monomethylether, propylene glycol monoethylether, dipropylene glycol diethylether, triethylene glycol monoethylether, and the like; ethyl acetate, butyl acetate, ethylene glycol monoethylether acetate, ethylene glycol monobutylether acetate, diethylene glycol monoethylether acetate, dipropylene glycol monomethylether acetate, ethanol, propanol, ethylene glycol, propylene glycol, carbitol, dimethylacetamide (DMAc), N,N-diethylacetamide, dimethylformamide (DMF), diethylformamide (DEF), N,N-dimethylacetamide (DMAc), N-methyl pyrrolidone (NMP), N-ethyl pyrrolidone (NEP), N-vinyl pyrrolidone 1,3-dimethyl-2-imidazolidinone, N,N-dimethylmethoxyacetamide, dimethyl sulfoxide, pyridine, dimethyl sulfone, hexamethyl phosphoamide, tetramethyl urea, N-methyl caprolactam, tetrahydrofurane, m-dioxane, P-dioxane, 1,2-dimethoxyethane, bis(2-methoxyethyl)ether, 1,2-bis(2-methoxyethoxy)ethane, and bis[2-(2-methoxyethoxy)]ether.

The organic solvent may be selected from any solvents capable of dissolving the polyamic acid without limitation and may include an aprotic polar solvent.

The aprotic polar solvent may include at least one of an amide solvent, such as N,N'-dimethylformamide (DMF), N,N'-dimethylacetamide (DMAc), and the like, a phenol solvent, such as p-chlorophenol, o-chlorophenol, and the like, N-methyl-pyrrolidone (NMP), γ-butyrolactone (GBL), diglyme, and mixtures thereof, without being limited thereto.

In some embodiments, an additional solvent, such as toluene, tetrahydrofuran, acetone, methyl ethyl ketone, methanol, ethanol, water, and the like, may be used to adjust solubility of the polyamic acid.

In one embodiment, the organic solvent particularly preferably used in preparation of the precursor composition may be an amide solvent, for example, N,N-dimethylformamide and N,N-dimethylacetamide.

In one embodiment, the first catalyst having a linear structure may include at least one selected from the group consist of dimethylacetamide (DMAc), N,N-diethylacetamide, dimethylformamide (DMF), and diethylformamide (DEF), most preferably dimethylformamide in terms of improvement in thermal conductivity.

In one embodiment, the second catalyst having a ring structure may include at least one selected from the group consist of N-methyl-2-pyrrolidone (NMP), N-ethylpyrrolidone (NEP), N-vinylpyrrolidone, and 1,3-dimethyl-2-imidazolidinone, specifically N-methylpyrrolidone.

In one embodiment, the first catalyst and the second catalyst may be added in a total amount of 1.5 moles to 4.5 moles, specifically 2.5 moles to 3.5 moles, per 1 mole of an amic acid group in the polyamic acid solution. If the content of the first catalyst or the second catalyst exceeds or is less than the above range, there can be difficulty obtaining a suitable molecular weight and viscosity of the polyamic acid solution and the polyimide film or the graphite sheet can suffer from deterioration in thermal and/or mechanical properties.

The method for manufacturing the polyimide film according to the present invention may be performed using chemical imidization or combined imidization, and may include, for example, mixing the dehydration agent and the imidization agent with the polyamic acid solution to prepare the precursor composition.

Here, the "dehydration agent" refers to a component that promotes ring-closing reaction through dehydration of the polyamic acid and may include at least one selected from the group consisting of acetic anhydride, propionic anhydride and lactic anhydride, without being limited thereto. The dehydration agent may be present in an amount of 1.5 moles to 4.5 moles per 1 mole of the amic acid group in the polyamic acid solution.

Further, the "imidization agent" refers to a component that promotes ring-closure reaction of the polyamic acid and may be selected from among tertiary amines. For example, the imidization agent may include at least one selected from the group consisting of β-picoline, quinoline, isoquinoline and pyridine, without being limited thereto, and may be present in an amount of 0.15 moles to 0.6 moles per 1 mole of the amic acid group in the polyamic acid solution.

If the content of each of the dehydration agent and the imidization agent is less than the above range, there can be problems such as a long process time or film fracture, and if the content of each of the dehydration agent and the imidization agent exceeds the above range, there can be a problem of deterioration in transparency of the manufactured film.

In addition, the method according to the present invention may include casting the precursor composition onto the support to form the gel film. In one embodiment, the precursor composition cast on the support may be dried at a temperature of 100° C. to 130° C.

If the drying temperature is less than 100° C., efficient drying cannot be achieved due to an excessively long drying time, and if the drying temperature exceeds 130° C., the polyimide film can suffer from deterioration in uniformity.

Further, the method according to the present invention may be performed using combination of chemical imidization and thermal imidization and may include imidizing the precursor composition through heat treatment of the gel film to form a polyimide film. In one embodiment, the gel film may be subjected to heat treatment at a temperature of 500° C. to 600° C.

If the imidization temperature is less than 500° C., not only is it difficult to achieve a desired level of improvement in thermal conductivity, but there is also a problem of deterioration in mechanical strength of the polyimide film or an excessively long imidization time through deterioration in imidization rate. If the imidization temperature exceeds 600° C., excessive energy can be consumed in imidization and the polyimide film can suffer from increase in the number of defects on an external appearance thereof.

The polyimide film according to the present invention may further include fillers. In one embodiment, the fillers may include at least one selected from the group consisting of dicalcium phosphate, barium sulfate and calcium carbonate. The fillers may be present in an amount of 2,000 ppm to 5,000 ppm based on the weight of the polyamic acid and may have an average particle diameter of 1.0 μm to 5.0 μm. Such fillers can be sublimated to form voids in the graphite sheet in the course of carbonization and graphitization in manufacture of the graphite sheet.

If the content of the fillers is less than 2,000 ppm, the polyimide film can suffer from deterioration in process handling properties due to deterioration in roughness and surface friction, and if the content of the fillers exceeds 5,000 ppm, the polyimide film can suffer from deterioration in mechanical properties.

The present invention provides a polyimide film manufactured by the method described above and has the following advantages.

Specifically, the polyimide film according to the present invention has not only a high packing density between imide molecules in the polyimide film, but also high uniformity of a polymer structure therein through drying and imidization at an optimal temperature. Thus, a graphite sheet manufactured using such a polyimide film can achieve further improvement in thermal conductivity without deterioration in mechanical strength, thereby securing good heat dissipation satisfying requirements for miniaturization, thickness reduction, and high integration.

The present invention provides a graphite sheet manufactured using the polyimide film and having improved thermal conductivity. According to the present invention, the graphite sheet may be manufactured through carbonization and graphitization of the polyimide film.

Carbonization of the polyimide film may be performed using a hot press and/or an electric furnace under a reduced pressure or under a nitrogen gas atmosphere. In one embodiment, carbonization may be performed by raising the temperature of the furnace from room temperature to about 1,000° C. to about 1,500° C. and maintaining the temperature under a nitrogen gas or an argon gas atmosphere for about 1 hour to about 12 hours, specifically for about 1 hour to about 5 hours. It should be understood that these conditions are provided for illustration and the present invention is not limited thereto.

Graphitization may be performed subsequent to carbonization of the polyimide film. Graphitization may also be performed on a hot press and/or in an electric furnace. Graphitization may be performed under an inert gas atmosphere and one example of the inert gas may be a mixed gas of argon and a small amount of helium. Specifically, heat treatment for graphitization may be performed at a temperature of 2,500° C. or more, preferably at a temperature of 2,700° C. to 3,000° C. in terms of economic feasibility and process efficiency.

In one embodiment, the graphite sheet manufactured through carbonization and graphitization (in addition to a rolling process thereafter) may have a thickness of 10 μm to 100 preferably 18 μm to 60 and a thermal conductivity of 1,600 W/(m·K) or more.

The present invention provides an electric device including the graphite sheet.

MODE FOR INVENTION

Next, the present invention will be described in more detail with reference to some examples. It should be understood that these examples are provided for illustration only and are not to be in any way construed as limiting the invention.

Example 1

Preparation of Precursor Composition

As an organic solvent, 404.8 g of dimethylformamide was placed in a 0.5 L reactor under a nitrogen atmosphere.

With the temperature of the reactor set to 20° C., 45.59 g of 4,4'-oxydianiline was added as a diamine monomer and stirred together with the solvent for 30 minutes to dissolve the diamine monomer, and 49.66 g of pyromellitic dianhydride was added as a dianhydride monomer to the resulting solution, followed by stirring, thereby preparing a polyamic acid solution.

Next, 1.6 g of β-picoline as an imidization agent, 12.0 g of acetic anhydride as a dehydration agent, 6.8 g of dimethylformamide as a first catalyst, and 2.3 g of N-methyl-2-pyrrolidone as a second catalyst were added to the polyamic acid solution in the reactor.

Then, 0.26 g of dicalcium phosphate particles having an average particle diameter of 3 μm was added as inorganic fillers to the resulting solution and stirred for 1 hour while maintaining the temperature of the reactor, thereby preparing a precursor composition.

Here, N-methyl-2-pyrrolidone was present in a molar amount of 20 mol % based on the total moles of dimethylformamide and N-methyl-2-pyrrolidone, and β-picoline was present in a molar ratio of 0.39 and acetic anhydride was present in a molar ratio of 2.65 per 1 mole of an amic acid group in the polyamic acid. For comparison of Examples with Comparison Examples, the amounts of these components are summarized in Table 1.

Manufacture of Gel Film

A gel film was manufactured by depositing the prepared precursor composition in a presumed weight of 70 g on a stainless endless belt to form a 50 μm thick polyimide film, followed by drying at 110° C. with hot air for 4 minutes.

Manufacture of Polyimide Film

The manufactured gel film was peeled off of the endless belt and secured to a tenter. Then, the tenter having the gel film secured thereto was placed in a vacuum oven and heated at 500° C. for 4 minutes to complete imidization. Thereafter, the temperature was slowly lowered and the film was removed from the tenter, thereby providing a polyimide film.

Examples 2 to 5

Polyimide films were manufactured in the same manner as in Example 1 except that the content of each of dimethylformamide and N-methyl-2-pyrrolidone was changed as listed in Table 1.

Examples 6 and 7

Polyimide films were manufactured in the same manner as in Example 1 except that the drying temperature of the gel film with hot air was changed as listed in Table 1.

Examples 8 and 9

Polyimide films were manufactured in the same manner as in Example 1 except that the imidization temperature of the gel film in the vacuum oven was changed as listed in Table 1.

Comparative Example 1

A polyimide film was manufactured in the same manner as in Example 1 except that N-methyl-2-pyrrolidone was not used as a solvent and the content of dimethylformamide was increased.

Comparative Examples 2 to 5

Polyimide films were manufactured in the same manner as in Example 1 except that the content of each of dimethylformamide and N-methyl-2-pyrrolidone was changed as listed in Table 1.

Comparative Examples 6 and 7

Polyimide films were manufactured in the same manner as in Example 1 except that the drying temperature of the gel film with hot air was changed as listed in Table 1.

Comparative Examples 8 and 9

Polyimide films were manufactured in the same manner as in Example 1 except that the imidization temperature of the gel film in the vacuum oven was changed as listed in Table 1.

Comparative Examples 10 to 13

Polyimide films were manufactured in the same manner as in Example 1 except that the content of each of dimethylformamide and N-methyl-2-pyrrolidone, the drying temperature and the imidization temperature were changed as listed in Table 1.

TABLE 1

|  | Dimethyl-formamide (mole ratio) | N-methyl-2-pyrrolidone (mole ratio) | Content of N-methyl-2-pyrrolidone (mol %) | Drying temperature (° C.) | Imidization temperature (° C.) |
| --- | --- | --- | --- | --- | --- |
| Example 1 | 2.12 | 0.53 | 20 | 110 | 500 |
| Example 2 | 2.39 | 0.27 | 10 | 110 | 500 |
| Example 3 | 2.25 | 0.40 | 15 | 110 | 500 |
| Example 4 | 1.99 | 0.66 | 25 | 110 | 500 |
| Example 5 | 1.86 | 0.80 | 30 | 110 | 500 |
| Example 6 | 2.12 | 0.53 | 20 | 120 | 500 |
| Example 7 | 2.12 | 0.53 | 20 | 130 | 500 |
| Example 8 | 2.12 | 0.53 | 20 | 110 | 540 |
| Example 9 | 2.12 | 0.53 | 20 | 110 | 580 |
| Comparative Example 1 | 2.65 | 0 | 0 | 110 | 500 |
| Comparative Example 2 | 2.52 | 0.13 | 5 | 110 | 500 |
| Comparative Example 3 | 1.72 | 0.93 | 35 | 110 | 500 |
| Comparative Example 4 | 1.59 | 1.06 | 40 | 110 | 500 |
| Comparative Example 5 | 1.33 | 1.33 | 50 | 110 | 500 |
| Comparative Example 6 | 2.12 | 0.53 | 20 | 90 | 500 |
| Comparative Example 7 | 2.12 | 0.53 | 20 | 80 | 500 |
| Comparative Example 8 | 2.12 | 0.53 | 20 | 110 | 480 |
| Comparative Example 9 | 2.12 | 0.53 | 20 | 110 | 460 |
| Comparative Example 10 | 2.12 | 0.53 | 20 | 90 | 460 |
| Comparative Example 11 | 2.52 | 0.13 | 5 | 110 | 460 |
| Comparative Example 12 | 1.59 | 1.06 | 40 | 90 | 500 |
| Comparative Example 13 | 1.33 | 1.33 | 50 | 90 | 460 |

Experimental Example 1: Measurement of Thermal Conductivity

Each of the polyimide films of Examples and Comparative Examples interposed between graphite plates was heated to 1,200° C. at a heating rate of 1° C./min in a high temperature furnace under a nitrogen atmosphere and was left at the same temperature for about 2 hours (carbonization). Then, the polyimide film was heated to 2,800° C. at a heating rate of 20° C./min in an ultra-high temperature furnace under an argon atmosphere and was left for 8 hours (graphitization), followed by cooling, thereby preparing a graphite sheet.

Each of the graphite sheets was cut to a sample having a size of 1 inch in diameter and 25 μm in thickness and a heat diffusion rate was measured using the prepared sample by a laser flash method using a diffusion rate measurement instrument (Model: LFA 467, Netsch).

Thermal conductivity was calculated by multiplying the measured heat diffusion rate (an average value of heat diffusion rates measured five times at 25° C.) by density (weight/volume) and specific heat (theoretical value, 0.85 KJ/(Kg·K)). Results are shown in Table 2.

TABLE 2

|  | Thermal conductivity (W/m · K) |
| --- | --- |
| Example 1 | 1672.3 |
| Example 2 | 1612.9 |
| Example 3 | 1654.2 |
| Example 4 | 1667.5 |
| Example 5 | 1636.4 |
| Example 6 | 1624.4 |
| Example 7 | 1660.0 |
| Example 8 | 1601.1 |
| Example 9 | 1670.0 |
| Comparative Example 1 | 1542.3 |

TABLE 2-continued

|  | Thermal conductivity (W/m · K) |
| --- | --- |
| Comparative Example 2 | 1567.4 |
| Comparative Example 3 | 1592.4 |
| Comparative Example 4 | 1560.5 |
| Comparative Example 5 | 1501.7 |
| Comparative Example 6 | 1587.6 |
| Comparative Example 7 | 1569.2 |
| Comparative Example 8 | 1585.3 |
| Comparative Example 9 | 1580.0 |
| Comparative Example 10 | 1533.3 |
| Comparative Example 11 | 1549.8 |
| Comparative Example 12 | 1566.0 |
| Comparative Example 13 | 1556.1 |

Referring to Table 2, it could be seen that the polyimide films of Examples 1 to 9 satisfied the conditions according to the present invention relating to the content of N-methyl-2-pyrrolidone in the catalyst, the drying temperature and the imidization temperature and provided graphite sheets having a very good thermal conductivity of 1,600 W/(m·K) or more.

In addition, it could be seen that the polyimide film using a catalyst consisting of N-methyl-2-pyrrolidone alone (Comparative Example 1) and the polyimide films using a catalyst further comprising dimethylformamide outside the content range of the present invention (Comparative Examples 2 to 5) exhibited lower thermal conductivity than the polyimide films of Examples, and the polyimide films failing to satisfy the conditions for the drying temperature and/or the imidization temperature according to the present invention (Comparative Examples 6 to 13) had much lower thermal conductivity.

From these results, it can be seen that improvement in thermal conductivity of the graphite sheet manufactured using the polyimide film according to the present invention can be achieved when all of the conditions for the content of the catalyst having a ring structure, the drying temperature and the imidization temperature according to the present invention are satisfied, and cannot be achieved when any one of these conditions is not satisfied.

Experimental Example 2: Modulus Measurement

Modulus of each of the polyimide films manufactured in Examples 1 to 9 and Comparative Examples 1 to 13 was measured using an Instron 5564 model in accordance with ASTM D 882 and results are shown in Table 3.

TABLE 3

|  | Modulus (GPa) |
| --- | --- |
| Example 1 | 2.80 |
| Example 2 | 2.74 |
| Example 3 | 2.75 |
| Example 4 | 2.85 |
| Example 5 | 2.76 |
| Example 6 | 2.77 |
| Example 7 | 2.82 |
| Example 8 | 2.71 |
| Example 9 | 2.90 |
| Comparative Example 1 | 2.63 |
| Comparative Example 2 | 2.64 |
| Comparative Example 3 | 2.62 |
| Comparative Example 4 | 2.44 |
| Comparative Example 5 | 2.25 |
| Comparative Example 6 | 2.44 |
| Comparative Example 7 | 2.40 |
| Comparative Example 8 | 2.20 |
| Comparative Example 9 | 2.23 |
| Comparative Example 10 | 2.11 |
| Comparative Example 11 | 2.19 |
| Comparative Example 12 | 2.10 |
| Comparative Example 13 | 2.09 |

Referring to Table 3, it could be seen that the polyimide films of Examples 1 to 9 satisfying all of the conditions according to the present invention relating to the content of N-methyl-2-pyrrolidone in the catalyst, the drying temperature and the imidization temperature had a good modulus of 2.7 GPa or more. On the contrary, it could be seen that the polyimide films using a catalyst comprising more than 30 mol % of N-methyl-2-pyrrolidone (Comparative Examples 3 to 5) and the polyimide films subjected to imidization at a temperature of less than 500° C. (Comparative Examples 8 to 11) had lower modulus (in the range of 2.1 GPa to 2.6 GPa) than the polyimide films of Examples and that the polyimide film failing to satisfy all of these conditions of the present invention (Comparative Example 13) had much lower modulus (2.1 Gpa) than the polyimide films of Examples.

From these results, it can be seen that mechanical strength of the polyimide film varies particularly depending upon the relative content of the catalyst having a ring structure and the imidization temperature, and that the graphite sheet manufactured using the polyimide film satisfying all of the conditions of the present invention has good thermal conductivity and can prevent deterioration in mechanical strength.

It should be understood that various modifications, changes, alterations, and equivalent embodiments can be made by those skilled in the art without departing from the spirit and scope of the present invention.

INDUSTRIAL APPLICABILITY

The manufacturing method according to the present invention can control mechanical/chemical properties of a polyimide film using two or more types of catalysts having different properties upon imidization of the precursor composition and can prevent deterioration in mechanical strength of a graphite sheet manufactured using the polyimide film while improving thermal conductivity of the graphite sheet. In addition, thermal conductivity of the graphite sheet can be further improved by setting a drying temperature of a precursor composition and an imidization temperature of a gel film in particular ranges.

The manufacturing method according to the present invention does not require the use of a separate thermal conductivity enhancer or addition of a process and thus can reduce manufacturing costs in that thermal conductivity of the graphite sheet is improved through particular combination of the content of an existing catalyst and process conditions.

The invention claimed is:

1. A method for manufacturing a polyimide film for graphite sheets, comprising:
   mixing an organic solvent, a diamine monomer and a dianhydride monomer to prepare a polyamic acid solution;
   adding a dehydration agent, an imidization agent and a catalyst to the polyamic acid solution to prepare a precursor composition;
   forming a gel film by casting the precursor composition onto a support, followed by drying the precursor composition; and
   imidizing the precursor composition through heat treatment of the gel film to form a polyimide film,
   wherein the catalyst comprises a first catalyst having a linear structure and a second catalyst having a ring structure,
   the second catalyst being present in an amount of 10 mol % to 30 mol % based on the total moles of the first catalyst and the second catalyst.

2. The method according to claim 1, wherein the first catalyst and the second catalyst are added in a total amount of 1.5 moles to 4.5 moles per 1 mole of an amic acid group in the polyamic acid.

3. The method according to claim 1, wherein the dehydration agent is added in an amount of 1.5 moles to 4.5 moles and the imidization agent is added in an amount of 0.15 moles to 0.6 moles per 1 mole of an amic acid group in the polyamic acid solution.

4. The method according to claim 1, wherein, in the step of imidizing the precursor composition, the gel film is subjected to heat treatment at a temperature of 500° C. to 600° C.

5. The method according to claim 1, wherein, in the step of drying the precursor composition, the precursor composition is dried at 100° C. to 130° C.

6. The method according to claim 1, wherein the first catalyst comprises at least one selected from the group consisting of dimethylacetamide (DMAc), N,N-diethylacetamide, dimethylformamide (DMF), and diethylformamide (DEF).

7. The method according to claim 6, wherein the first catalyst is dimethylformamide.

8. The method according to claim 1, wherein the second catalyst is N-methyl-2-pyrrolidone.

9. The method according to claim 1, wherein the dehydration agent comprises at least one selected from the group consisting of acetic anhydride, propionic anhydride and lactic anhydride.

10. The method according to claim 1, wherein the imidization agent comprises at least one selected from the group consisting of β-picoline, quinoline, isoquinoline, and pyridine.

11. The method according to claim 1, wherein the precursor composition further comprises 2,000 ppm to 5,000 ppm of fillers having an average particle diameter of 1.0 μm to 5.0 μm based on the weight of the polyamic acid solution.

12. The method according to claim 11, wherein the fillers comprise at least one selected from the group consisting of dicalcium phosphate, barium sulfate and calcium carbonate.

13. A polyimide film manufactured by the method according to claim 1.

14. A graphite sheet manufactured through carbonization and/or graphitization of the polyimide film manufactured by the method according to claim 1, wherein the graphite sheet has a thickness of 18 μm to 60 μm and a thermal conductivity of 1,600 W/(m·K) or more.

* * * * *